United States Patent
Yoo

(10) Patent No.: US 8,472,234 B2
(45) Date of Patent: Jun. 25, 2013

(54) ANTI-FUSE CIRCUIT AND INTEGRATED CIRCUIT INCLUDING THE SAME

(75) Inventor: Keon Yoo, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 34 days.

(21) Appl. No.: 13/300,212

(22) Filed: Nov. 18, 2011

(65) Prior Publication Data
US 2013/0051111 A1   Feb. 28, 2013

(30) Foreign Application Priority Data
Aug. 29, 2011   (KR) .......................... 10-2011-0086517

(51) Int. Cl.
*G11C 17/14*   (2006.01)
(52) U.S. Cl.
USPC ......... 365/102; 365/149; 365/200; 365/225.7
(58) Field of Classification Search
USPC ................................................... 365/96, 102
See application file for complete search history.

(56) References Cited

U.S. PATENT DOCUMENTS

| | | | |
|---|---|---|---|
| 5,299,152 A * | 3/1994 | Ishihara et al. | 365/96 |
| 6,351,135 B1 | 2/2002 | Kim | |
| 7,206,247 B2 * | 4/2007 | Jenne | 365/225.7 |
| 8,254,198 B2 * | 8/2012 | Borot et al. | 365/225.7 |
| 2008/0198643 A1 | 8/2008 | Shin et al. | |
| 2009/0279376 A1 | 11/2009 | Yamada | |
| 2010/0246237 A1 | 9/2010 | Borot et al. | |

OTHER PUBLICATIONS

E. Miranda et al., "Breakdown and anti-breakdown events in high-field stressed ultrathin gate oxides", Solide-State Electronics, 2001, pp. 1327-1332, vol. 45, Elsevier Science Ltd.

* cited by examiner

*Primary Examiner* — Tan T. Nguyen

(57) ABSTRACT

An anti-fuse circuit and an integrated circuit (IC) including the same are disclosed, which are applied to a technology for use in all kinds of semiconductor devices or system ICs, each of which includes an anti-fuse circuit using the breakdown phenomenon of a gate oxide, so as to prevent the occurrence of an anti-breakdown phenomenon. The anti-fuse circuit includes an anti-fuse, a breakdown of which occurs by a program voltage, configured to be electrically short-circuited, a read controller configured to be controlled by a read voltage received through the anti-fuse so as to output a short-circuiting status of the anti-fuse, and a switching unit configured to form a path that prevents a current flowing through the anti-fuse from being applied to the read controller during a program operation and prevents a current from flowing in the anti-fuse during a read operation.

20 Claims, 4 Drawing Sheets

ANTI-FUSE CIRCUIT AND INTEGRATED CIRCUIT INCLUDING THE SAME

CROSS-REFERENCE TO RELATED APPLICATION

The priority of Korean patent application No. 10-2011-0086517 filed on Aug. 29, 2011, the disclosure of which is hereby incorporated in its entirety by reference, is claimed.

BACKGROUND OF THE INVENTION

Embodiments of the present invention relate to an anti-fuse circuit and an integrated circuit (IC) including the same, and more specifically, to a technology for use in all kinds of semiconductor devices or system ICs, each of which includes an anti-fuse circuit using a breakdown phenomenon of a gate oxide, which is capable of preventing the occurrence of an anti-breakdown phenomenon of the gate oxide in the anti-fuse circuit.

Semiconductor devices cannot be used as memory devices when a defect or failure occurs in at least one unit cell therein during a fabrication process. The memory device having at least one failed unit cell is classified as a defective product, and results in decreased production efficiency.

Therefore, a technology has been introduced for substituting a defective cell with a redundancy cell included in a memory device so as to restore the memory device, which increases the production yield and reduces production costs.

A repair task of substituting the defective cell with the redundancy cell is designed to use a redundancy row and/or a redundancy column formed in every cell array, such that the row or column including the defective memory cell is replaced with the redundancy row or redundancy column.

For example, if a defective cell is detected in a test process after the fabrication process is finished, a program operation for making access to a redundancy cell with an address input to access to the defective cell is carried out in an internal circuit of the memory device.

Therefore, if an address signal corresponding to a defective line used to select the defective cell is input to the memory device, a redundancy line used to select the redundancy cell is accessed instead of the defective line.

A typical repair process is designed to use a fuse. The fuse-based repair process uses fuses built in the internal circuit to repair the defective cell, and applies overcurrent to a specific fuse located at a line coupled to the row or column including the defective cell such that the specific fuse is blown.

In addition, in order to replace the row or column including the defective cell with the redundancy row or redundancy column, the above-mentioned repair process may use a variety of methods including a method for burning off a fuse with laser beams, a method for interconnecting junction parts with laser beams, and a method of using the EEPROM programming.

From among the above-mentioned methods, the method for burning off the fuse with laser beams is considered the simplest and most reliable method and has the lowest probability of causing wrong programming. As a result, it has been widely used. In this method, a fuse is made of polysilicon or metal.

However, since the method for repairing a semiconductor device using a fuse performs the repair process on a wafer level, it cannot be applied to a packaged semiconductor device. Therefore, a new method to overcome the limitations of the above-mentioned repair method using an anti-fuse is introduced.

The method using the anti-fuse can perform a program capable of easily repairing a defective cell, even if it is included in the packaged memory device. The anti-fuse performs the opposite function to the fuse. That is, the anti-fuse starts with a high resistance, e.g., 100 MΩ and is designed to create an electrically conductive path, whereas the fuse starts with a low resistance, e.g., less than 100 MΩ and is designed to break an electrically conductive path.

Generally, the anti-fuse is formed with a very thin dielectric material of a non-conducting amorphous material, e.g., $SiO_2$, silicon nitride, tantalum oxide, or ONO (silicon dioxide-silicon nitride-silicon dioxide) between two electrical conductors.

In other words, the anti-fuse is configured by forming a gate oxide between a silicon active region and a gate electrode. The anti-fuse may have the same structure as that of a transistor, widely used as a semiconductor device. The anti-fuse may or may not include a source/drain region as necessary.

In accordance with a programming operation of the anti-fuse, a predetermined voltage (program voltage, for example, 10V) is applied to the anti-fuse during a sufficient period of time such that the dielectric material located between two conductors is broken down to program the anti-fuse. Therefore, if the anti-fuse is programmed as described above, the two electrical conductors of the anti-fuse short-circuit, such that the anti-fuse has very low resistance.

As described above, the anti-fuse can be easily programmed and has a substantial difference in resistance before and after the programming operation. As a result, the anti-fuse has been widely used in semiconductor devices, for example, field programming gate array (FPGA), programmable read only memory (PROM), programmable array logic (PAL), etc.

From among various anti-fuses, FIG. 1 illustrates a MOS-type anti-fuse that is comprised of one MOS capacitor MC1 in which a source and a drain of an NMOS transistor are coupled to each other. While the MOS-type anti-fuse is programmed, a high program voltage Vpgm, which has a voltage level equal to or higher than that of an operation voltage, is applied to a gate electrode of the MOS capacitor MC1 such that a gate oxide film is broken down.

In other words, the program voltage Vpgm causes breakdown of a dielectric material. This electrical short-circuited status is considered a programmed anti-fuse.

If the anti-fuse is programmed, in order to read out information stored in the anti-fuse, a read voltage Vread is applied through a read circuit to determine whether the anti-fuse is opened or short-circuited. However, when repeatedly performing the read operation on the anti-fuse, an anti-breakdown phenomenon may occur in the anti-fuse by electrical stress caused by the read voltage Vread. This means that the breakdown of the dielectric material may be recovered, such that the resistance status of the anti-fuse may be changed. Thus, information stored in the anti-fuse may be also changed.

In this case, the program voltage Vpgm and the read voltage Vread are provided through a driver D1. The program voltage Vpgm may change depending on the thickness of the gate oxide film.

If the single MOS capacitor MC1 is used as the anti-fuse, it is difficult to acquire uniform breakdown characteristics. That is, the breakdown of an oxide film occurs in a weak point of the oxide film. However, since such weak points of respective fuses are different in distribution and range, the individual fuses, whose dielectric material has been broken down, may have a different resistance from each other.

Further, provided that soft breakdown instead of hard breakdown occurs, resistance after soft breakdown increases, so that the anti-fuse programming may not be achieved normally, resulting in the occurrence of errors.

FIG. 2 shows an anti-breakdown phenomenon occurring in a general anti-fuse circuit.

The dielectric material in the anti-fuse circuit, which is broken down by the program voltage Vpgm, may be recovered by the anti-breakdown phenomenon caused by a voltage supplied in a subsequent repeated read operation.

The anti-breakdown phenomenon may unexpectedly reverse the program status of the anti-fuse. In this case, the anti-breakdown phenomenon may occur by a current flowing through the short-circuited anti-fuse.

As shown in the graph of FIG. 2, the breakdown phenomenon and anti-breakdown phenomenon may be repeated in response to a voltage applied to a gate electrode of the anti-fuse.

BRIEF SUMMARY OF THE INVENTION

Various embodiments of the present invention are directed to providing an anti-fuse circuit and an integrated circuit including the same, which substantially obviate one or more problems due to limitations or disadvantages of the related art.

Embodiments of the present invention relates to a method for preventing the anti-breakdown phenomenon by reducing an amount of a current flowing in a programmed anti-fuse during a read operation, resulting in improved reliability of the anti-fuse.

In accordance with one embodiment of the present invention, an anti-fuse circuit includes an anti-fuse configured to be electrically programmable by a program voltage; a read controller coupled to the anti-fuse and configured to be controlled by a read voltage received through the anti-fuse so as to output a programmed status of the anti-fuse through an output node; and a switching unit configured to form a path that prevents a current flowing through the anti-fuse from being applied to the read controller during a program operation and that substantially reduces an amount of a current flowing through the anti-fuse during a read operation.

In accordance with another embodiment of the present invention, an integrated circuit includes an anti-fuse circuit and an internal circuit configured to be activated in response to an output signal from the anti-fuse circuit, wherein the anti-fuse circuit includes an anti-fuse configured to be electrically programmed by a program voltage, a read controller coupled the anti-fuse and configured to be controlled by a read voltage received through the anti-fuse so as to output a programmed status of the anti-fuse through and output node that is coupled to the redundancy memory cell array; and a switching unit configured to form a path that prevents a current flowing through the anti-fuse from being applied to the read controller during a program operation and that substantially reduces an amount of a current flowing through the anti-fuse during a read operation.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
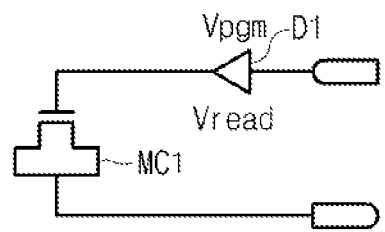
FIG. 1 illustrates a conventional anti-fuse circuit.
Figure 2:
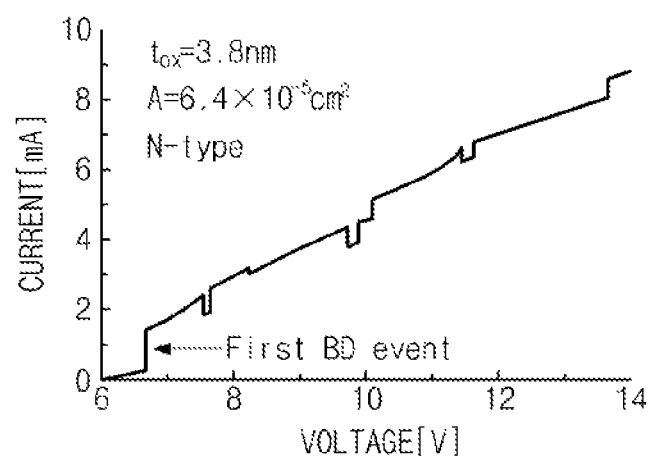
FIG. 2 shows an anti-breakdown phenomenon of a conventional anti-fuse circuit.
Figure 3:
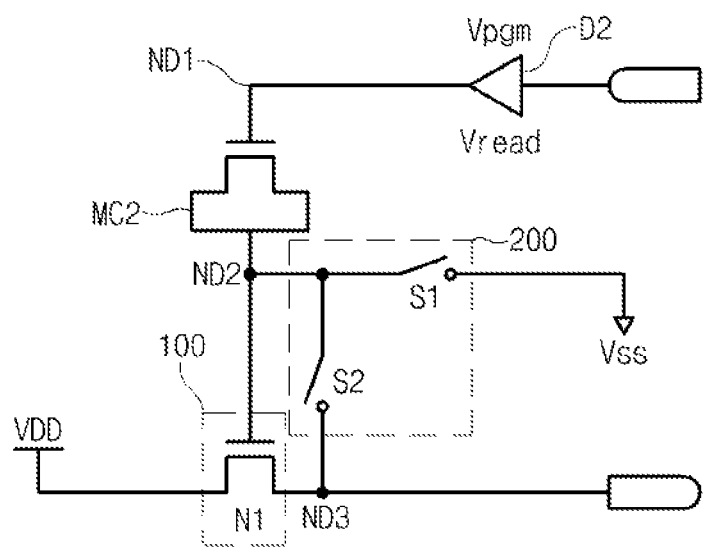
FIG. 3 illustrates an anti-fuse circuit according to an embodiment of the present invention.

FIG. 3 illustrates an anti-fuse circuit according to an embodiment of the present invention.

Referring to FIG. 3, the anti-fuse circuit includes a driver D2, an anti-fuse MC2 of a MOS capacitor type, a read controller 100, and a switching unit 200.

The driver D2 supplies a program voltage Vpgm and a read voltage Vread to the anti-fuse MC2. In this case, the program voltage Vpgm may change depending on the thickness of a gate oxide of the anti-fuse MC2.

The anti-fuse MC2 is formed of an NMOS transistor whose source and drain terminals are coupled to each other. The anti-fuse MC2 may be coupled to and disposed between a node ND1 and a node ND2.

The read controller 100 includes an NMOS transistor N1 coupled to and disposed between a power-supply voltage terminal VDD and a node ND3, and a gate terminal of the NMOS transistor N1 is coupled to the node ND2.

In an embodiment, the read controller 100 is driven only in a read operation to prevent a current from flowing in the anti-fuse MC2 during the read operation. Therefore, the read controller 100 is not driven while the anti-fuse MC2 is programmed in a program operation.

For the read controller 100, the node ND2 acts as an output of the switching unit 200. The anti-fuse MC2 is coupled to the gate terminal of the NMOS transistor N1 through the node ND2, such that the read controller 100 is controlled to prevent a current from flowing in the anti-fuse MC2 during the read operation.

The switching unit 200 includes switches S1 and S2. The first switch S1 is coupled to the node ND2 and a ground voltage terminal Vss. The second switch S2 is coupled to and disposed between the node ND2 and the node ND3.

The first switch S1 is turned on in the program operation to provide a ground voltage Vss to an output terminal of the anti-fuse MC2 and the gate terminal of the NMOS transistor N1, such that a high voltage is loaded only on the anti-fuse MC2. On the other hand, the first switch S1 is turned off in the read operation to make a path through which the read voltage Vread is applied to the gate terminal of the NMOS transistor N1.

The second switch S2 is turned on in the program operation to make a path between the node ND2 and the node ND3. This path prevents the program voltage Vpgm from being applied to the gate terminal of the NMOS transistor N1 and removes a voltage difference between the nodes ND2 and ND3. As a result, it is possible to prevent a gate oxide of the NMOS transistor N1 from being broken down by a substantial voltage difference between the nodes ND2 and ND3. On the other hand, the second switch S2 is turned off in the read operation and thus the read voltage Vread is supplied to the gate electrode of the NMOS transistor N1, which can prevent a current from flowing through the anti-fuse MC2.

Hereinafter, operations of the above-mentioned anti-fuse circuit according to the present invention will be described with reference to FIGS. 4 and 5.

Figure 4:
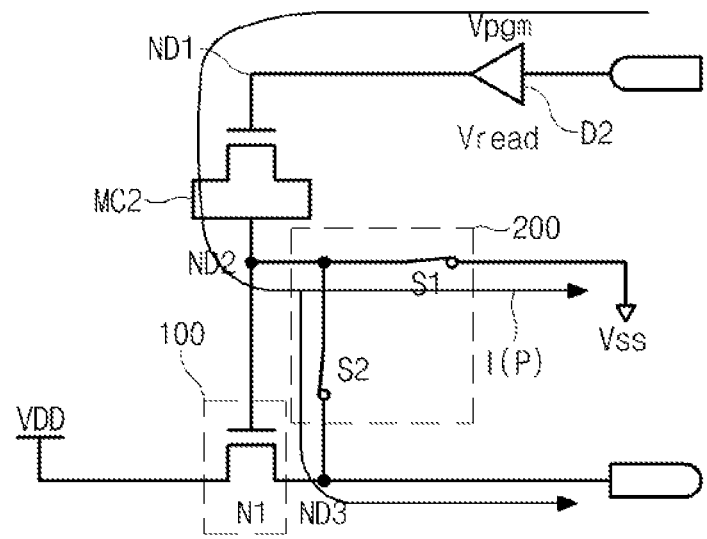
FIGS. 4 and 5 show operations of an anti-fuse circuit according to an embodiment of the present invention.
Figure 5:
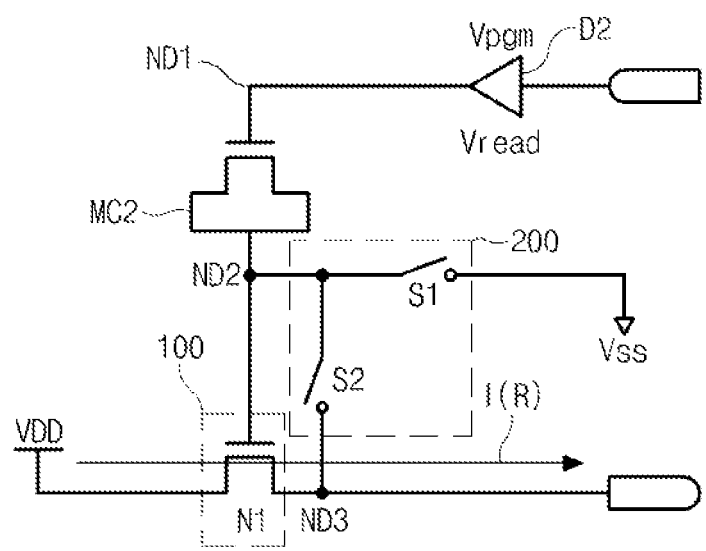

For convenience of description and better understanding of the present invention, FIG. 4 shows a current path during a program operation, and FIG. 5 shows a current path during a read operation.

In the program operation of the anti-fuse circuit, the switches S1 and S2 are closed. In an embodiment, the program voltage Vpgm of the driver D2 is applied to the node ND1, i.e., one end of the MOS capacitor MC2 acting as the anti-fuse. As the first switch S1 is closed, the ground voltage Vss is applied to the node ND2, i.e., the other end of the MOS capacitor MC2. Accordingly, a voltage difference occurs between the nodes ND1 and ND2, i.e., two ends of the MOS capacitor MC2.

As a result, a breakdown phenomenon is generated in the gate oxide of the MOS capacitor MC2 by the voltage difference between the nodes ND1 and ND2, such that the MOS capacitor MC2, acting as the anti-fuse, is programmed.

In an embodiment, the second switch S2 is also closed, so that a voltage applied to the node ND2 is not applied to the gate terminal of the NMOS transistor N1, and thus a current flows into the node ND3 through the second switch S2. Therefore, there is no voltage difference between the node ND2 and the node ND3, thus preventing the breakdown phenomenon from occurring in the gate oxide of the NMOS transistor N1.

FIG. 4 shows a flow of a current I(P) in the program operation. Because the switches S1 and S2 are closed in the program operation, the current I(P) is not applied to the gate terminal of the NMOS transistor N1 and, instead, flows to the ground voltage terminal Vss.

On the other hand, the switches S1 and S2 are opened in the read operation of the anti-fuse circuit. Under this condition, the read voltage Vread of the driver D2 is applied to the gate terminal of the NMOS transistor N1 through the MOS capacitor MC2 if the MOS capacitor MC2 is programmed, i.e., short-circuited, by the gate oxide that is broken down.

Accordingly, the NMOS transistor N2 is turned on by the read voltage Vread so that a power-supply voltage VDD is supplied to the node ND3. FIG. 5 shows a flow of a current I(R) in the read operation. The short-circuited status of the MOS capacitor MC2, acting as the anti-fuse, can be detected by the read current I(R) flowing to the ND3.

Therefore, during the read operation, the read voltage Vread is applied to the gate terminal of the NMOS transistor N1 and no current flows through the MOS capacitor MC2.

That is, the MOS capacitor MC2 is connected to the gate terminal of the NMOS transistor N1, so that it is possible to substantially reduce an amount of a current flowing through the MOS capacitor MC2 in the read operation. Accordingly, although the read operation is repeatedly carried out, an increase of resistance, which is caused by the anti-breakdown phenomenon, is prevented in the MOS capacitor MC2.

Figure 6:
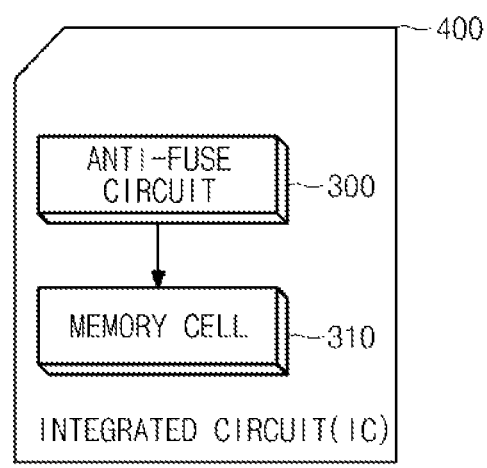
FIG. 6 illustrates an integrated circuit including an anti-fuse circuit according to another embodiment of the present invention.

FIG. 6 illustrates an integrated circuit (IC) including an anti-fuse circuit according to another embodiment of the present invention.

Referring to FIG. 6, the integrated circuit 400, including the anti-fuse circuit 300, may be applied to semiconductor memory devices such as DRAMs, SRAMs, embedded memories, etc.

In addition, the integrated circuit (IC) 400, including the anti-fuse circuit 300, may be applied to next generation memory devices such as PCRAMs, ReRAMs, FeRAMs, etc.

The above-mentioned semiconductor memory devices are designed to include the anti-fuse circuit 300, which acts as a switch for activating an internal circuit, e.g., a redundancy memory cell 310 configured to repair a defective memory cell (not shown). In addition, the anti-fuse circuit in accordance with the above embodiment can be applied to a variety of anti-fuse circuits for use in a general system IC. For example, the anti-fuse circuit may be used in activating a circuit configured to change at least one of a set value, a test condition, an operation condition, and so on of the system IC after the entire fabrication processes of the system IC are completed.

As is apparent from the above description, the above-mentioned exemplary embodiments of the present invention have the following characteristics. The embodiments provide a method for preventing the anti-breakdown phenomenon from occurring in an anti-fuse, after the anti-fuse is programmed, by reducing an amount of a current flowing into the programmed anti-fuse during the read operation, resulting in enhancement of the reliability of the anti-fuse.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An anti-fuse circuit comprising:
   an anti-fuse configured to be electrically programmable by a program voltage;
   a read controller coupled to the anti-fuse and configured to be controlled by a read voltage received through the anti-fuse so as to output a programmed status of the anti-fuse through an output node; and
   a switching unit configured to form a path that prevents a current flowing through the anti-fuse from being applied to the read controller during a program operation and that substantially reduces an amount of a current flowing through the anti-fuse during a read operation.

2. The anti-fuse circuit according to claim 1, wherein the anti-fuse includes a MOS-type capacitor.

3. The anti-fuse circuit according to claim 2, wherein a gate oxide of the MOS-type capacitor is broken down by the program voltage during the program operation.

4. The anti-fuse circuit according to claim 1, further comprising a driver configured to provide the program voltage or the read voltage to the anti-fuse.

5. The anti-fuse circuit according to claim 1, wherein the read controller includes an NMOS transistor coupled to and disposed between a power-voltage input terminal and the output node so that a gate terminal of the NMOS transistor is coupled to the anti-fuse.

6. The anti-fuse circuit according to claim 1, wherein the switching unit includes:
a first switch coupled to and disposed between the anti-fuse and a ground voltage terminal; and
a second switch coupled to and disposed between the anti-fuse and the output node.

7. The anti-fuse circuit according to claim 6, wherein the first switch is turned on in the program operation so as to make a current path from the anti-fuse to the ground voltage terminal, and is turned off in the read operation so as to allow the read voltage to be applied to the read controller.

8. The anti-fuse circuit according to claim 6, wherein the second switch is turned on in the program operation so as to make a current path from the anti-fuse to the output node, and is turned off in the read operation so as to allow the read voltage to be applied to the read controller.

9. An integrated circuit comprising:
an anti-fuse circuit; and
an internal circuit configured to be activated in response to an output signal from the anti-fuse circuit,
wherein the anti-fuse circuit comprises:
an anti-fuse configured to be electrically programmable by a program voltage;
a read controller coupled the anti-fuse and configured to be controlled by a read voltage received through the anti-fuse so as to output a programmed status of the anti-fuse through an output node that is coupled to the redundancy memory cell array; and
a switching unit configured to form a path that prevents a current flowing through the anti-fuse from being applied to the read controller during a program operation and that substantially reduces an amount of a current flowing through the anti-fuse during a read operation.

10. The integrated circuit according to claim 9, wherein the anti-fuse includes a MOS-type capacitor.

11. The integrated circuit according to claim 10, wherein a gate oxide of the MOS-type capacitor is broken down by the program voltage during the program operation.

12. The integrated circuit according to claim 9, wherein the anti-fuse circuit further comprises a driver configured to provide the program voltage or the read voltage to the anti-fuse.

13. The integrated circuit according to claim 9, wherein the read controller includes an NMOS transistor coupled to and disposed between a power-voltage input terminal and the output node so that a gate terminal of the NMOS transistor is coupled to the anti-fuse.

14. The integrated circuit according to claim 9, wherein the switching unit includes:
a first switch coupled to and disposed between the anti-fuse and a ground voltage terminal; and
a second switch coupled to and disposed between the anti-fuse and the output node.

15. The integrated circuit according to claim 14, wherein the first switch is turned on in the program operation so as to make a current path from the anti-fuse to the ground voltage terminal, and is turned off in the read operation so as to allow the read voltage to be applied to the read controller.

16. The integrated circuit according to claim 14, wherein the second switch is turned on in the program operation so as to make a current path from the anti-fuse to the output node, and is turned off in the read operation so as to allow the read voltage to be applied to the read controller.

17. The integrated circuit according to claim 9, wherein the internal circuit is configured to change at least one of a set value, a test condition, and an operation condition in the integrated circuit.

18. The integrated circuit according to claim 9, wherein the internal circuit comprises a circuit for substituting a defective or failed memory cell with a redundancy memory cell.

19. The integrated circuit according to claim 18, wherein the integrated circuit comprises a semiconductor memory device.

20. The integrated circuit according to claim 19, wherein the semiconductor memory device comprises any one of a DRAM device, an SRAM device, an embedded memory device, a PCRAM device, a ReRAM device, and a FeRAM device.

* * * * *